(12) United States Patent
Sugimoto (10) Patent No.: US 11,619,879 B2
(45) Date of Patent: Apr. 4, 2023

(54) IMPRINT APPARATUS, INFORMATION PROCESSING APPARATUS, IMPRINT METHOD, AND METHOD OF MANUFACTURING ARTICLE

(71) Applicant: CANON KABUSHIKI KAISHA, Tokyo (JP)

(72) Inventor: Toyoaki Sugimoto, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 130 days.

(21) Appl. No.: 17/091,399

(22) Filed: Nov. 6, 2020

(65) Prior Publication Data

US 2021/0181623 A1     Jun. 17, 2021

(30) Foreign Application Priority Data

Dec. 13, 2019    (JP) .............................. JP2019-225760

(51) Int. Cl.
    *G03F 7/00*         (2006.01)
(52) U.S. Cl.
    CPC .................................. *G03F 7/0002* (2013.01)
(58) Field of Classification Search
    CPC ....... G03F 7/0002; G03F 7/161; H01L 21/027
    See application file for complete search history.

(56) References Cited

U.S. PATENT DOCUMENTS

| | | | |
|---|---|---|---|
| 8,574,479 B2 | 11/2013 | Aoki et al. | |
| 9,176,376 B2 | 11/2015 | Mataki | |
| 2002/0094496 A1* | 7/2002 | Choi | G03F 7/0002 430/324 |
| 2014/0131313 A1* | 5/2014 | Wakamatsu | G06F 30/20 703/2 |
| 2016/0129614 A1* | 5/2016 | Yamazaki | G03F 7/0002 264/293 |
| 2018/0253000 A1* | 9/2018 | Saito | G03F 7/0002 |
| 2019/0351589 A1* | 11/2019 | Aihara | H01L 21/027 |

FOREIGN PATENT DOCUMENTS

| | | |
|---|---|---|
| JP | 2011061029 A | 3/2011 |
| JP | 2011181829 A | 9/2011 |
| JP | 2016009798 A | 1/2016 |

\* cited by examiner

*Primary Examiner* — Alexander M Weddle (74) *Attorney, Agent, or Firm* — Rossi, Kimms & McDowell LLP (57) ABSTRACT

The preset invention provides an imprint apparatus including a supplying unit including a plurality of orifices which discharge droplets of an imprint material, and configured to supply the imprint material onto a substrate via the plurality of the orifices, and a processing unit configured to perform processing to determine positions where the droplets of the imprint material are to be supplied on the substrate based on information, which indicates a relationship between an elapsed time since the supplying unit has supplied the imprint material on the substrate and a spread of the droplets of the imprint material on the substrate corresponding to the elapsed time, and a predicted time since the supplying unit has supplied the imprint material onto the substrate until a mold is brought into contact with imprint material.

14 Claims, 9 Drawing Sheets

IMPRINT APPARATUS, INFORMATION PROCESSING APPARATUS, IMPRINT METHOD, AND METHOD OF MANUFACTURING ARTICLE

BACKGROUND OF THE INVENTION

Field of the Invention

The present invention relates to an imprint apparatus, an information processing apparatus, an imprint method, and a method of manufacturing an article.

Description of the Related Art

A micropatterning technique in which a fine uneven pattern that has been formed on a mold is formed onto a substrate by using the mold to form an imprint material on the substrate has gained attention. The micropatterning technique is also referred to as an imprint technique, and a fine pattern (structure) on the order of several nm can be formed on a substrate.

Japanese Patent Laid-Open No. 2011-61029 proposes, with respect to an imprint apparatus that employs an imprint technique, a technique in which an imprint material is continuously supplied to a plurality of shot regions on a substrate and the imprint material is subsequently cured while a mold and the imprint material have been brought into contact with each other on each shot region.

However, in the technique disclosed in Japanese Patent Laid-Open No. 2011-61029, the amount of time from the supplying of the imprint material (droplets) until the mold is brought into contact with the imprint material varies for each shot region. Hence, the imprint material droplets on the substrate will spread in accordance with the elapsed time since the imprint material has been supplied, and, depending on this spread, the imprint material can sometimes leak outside (to be referred to as "leakage" hereinafter) the shot region (mold) or the substrate when the mold is brought into contact with the imprint material. If this kind of leakage occurs, the location where the imprint material has leaked out may become defective and the pattern to be formed on a shot region to which the imprint material has leaked out may also become defective.

SUMMARY OF THE INVENTION

The present invention provides an imprint apparatus advantageous in reducing pattern defects formed on a substrate.

According to one aspect of the present invention, there is provided an imprint apparatus that forms an imprint material pattern on a substrate by using a mold, including a supplying unit including a plurality of orifices which discharge droplets of an imprint material, and configured to supply the imprint material onto the substrate via the plurality of the orifices, and a processing unit configured to perform processing to determine positions where the droplets of the imprint material are to be supplied on the substrate based on information, which indicates a relationship between an elapsed time since the supplying unit has supplied the imprint material on the substrate and a spread of the droplets of the imprint material on the substrate corresponding to the elapsed time, and a predicted time since the supplying unit has supplied the imprint material onto the substrate until the mold is brought into contact with imprint material.

Further aspects of the present invention will become apparent from the following description of exemplary embodiments with reference to the attached drawings.

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

Figure 1:
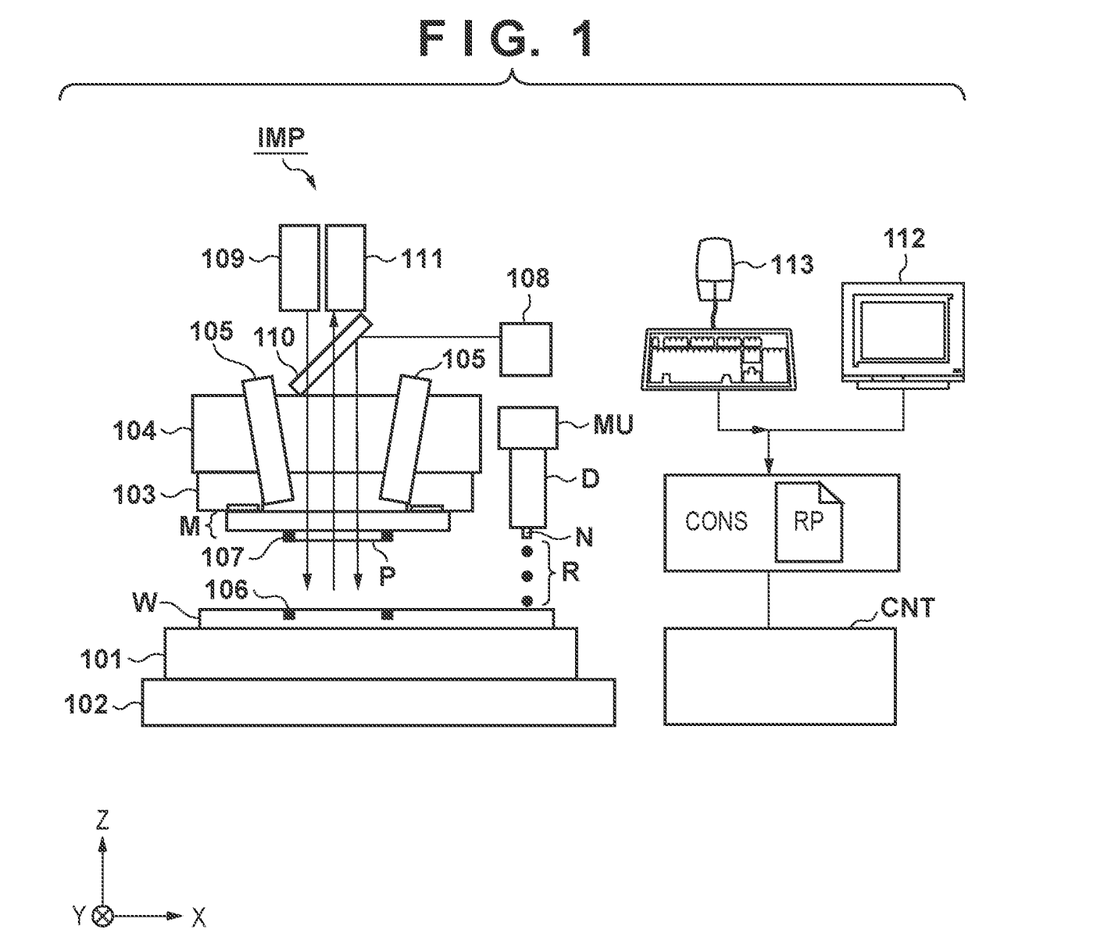
FIG. 1 is a schematic view showing the arrangement of an imprint apparatus as an aspect of the present invention.

FIG. 1 is a schematic view showing the arrangement of an imprint apparatus IMP according to one aspect of the present invention. The imprint apparatus IMP is employed in a lithography process which is a manufacturing process of an article such as a semiconductor device, a liquid crystal display element, a magnetic storage medium, or the like. The imprint apparatus IMP is a lithography apparatus that forms a pattern on a substrate, more specifically, an imprint material pattern on a substrate by using a mold. The imprint apparatus IMP brings a mold into contact with an uncured imprint material supplied on a substrate and applies curing energy to the imprint material, thereby forming a cured product pattern to which the pattern of the mold has been transferred.

As the imprint material, a material (a curable composition) which can be cured by receiving curing energy is used. An electromagnetic wave, heat, or the like is used as the curing energy. As the electromagnetic wave, for example, light selected from the wavelength range of 10 nm (inclusive) to 1 mm (inclusive) is used. More specific examples of the electromagnetic wave are infrared light, a visible light beam, and ultraviolet light.

The curable composition is a composition cured by light irradiation or by heat application. A photo-curable composition cured by light irradiation contains at least a polymerizable compound and a photopolymerization initiator, and may contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component.

The imprint material may be applied in a film shape onto the substrate by a spin coater or a slit coater. The imprint material may be applied, onto the substrate, in a droplet shape or in an island or film shape formed by connecting a plurality of droplets by using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used. A member made of a material different from that of the substrate may be formed on the surface of the substrate, as needed. More specifically, examples of the substrate are a silicon wafer, a semiconductor compound wafer, and silica glass.

In the specification and the accompanying drawings, directions will be indicated on an XYZ coordinate system in which directions parallel to the surface of a substrate W are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are $\theta X$, $\theta Y$, and $\theta Z$, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the $\theta X$-axis, the $\theta Y$-axis, and the $\theta Z$-axis means control or driving concerning a rotation about an axis parallel to the X-axis, a rotation about an axis parallel to the Y-axis, and a rotation about an axis parallel to the Z-axis, respectively. In addition, a position is information that is specified based on coordinates on the X-, Y-, and Z-axes, and a posture is information that is specified by values on the $\theta X$-, $\theta Y$-, and $\theta Z$-axes. Positioning means controlling the position and/or the posture. Alignment includes controlling the position and the posture of at least one of the substrate and the mold.

This embodiment will describe a case in which an ultraviolet-curable imprint material that can be cured by ultraviolet irradiation is used as an imprint material (that is, a photocuring method is employed as the curing method of the imprint material). However, a thermoplastic or thermosetting imprint material may be used as the imprint material.

The imprint apparatus IMP includes a substrate chuck 101 which holds the substrate W, a substrate stage 102 which supports and moves the substrate chuck 101, a mold chuck 103 which holds a mold M on which a pattern P has been formed, and a mold stage 104 which supports and moves the mold chuck 103. The imprint apparatus IMP also includes a supplying unit (dispenser) D which supplies an imprint material R onto the substrate and a moving unit MU which moves the supplying unit D. The imprint apparatus IMP also includes a control unit CNT which controls the overall imprint apparatus IMP, a console unit CONS which generates (manages) a display screen (operation screen), a display unit 112 which displays the display screen, and an input unit 113 such as a keyboard, a mouse, or the like. The control unit CNT is formed by an information processing apparatus (a computer) which includes a CPU, a memory, and the like, and causes the imprint apparatus IMP to operate by integrally controlling the units of the imprint apparatus IMP in accordance with programs stored in a storage unit.

Figure 2:
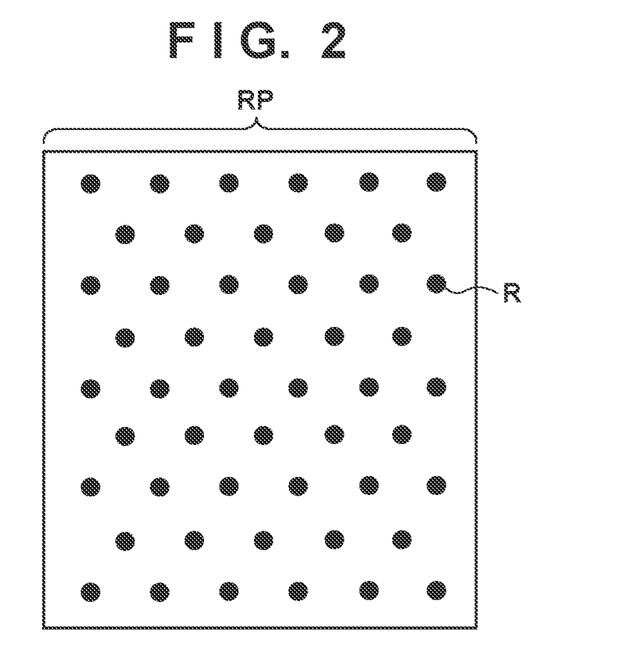
FIG. 2 is a view showing an example of a drop recipe.
Figure 3:
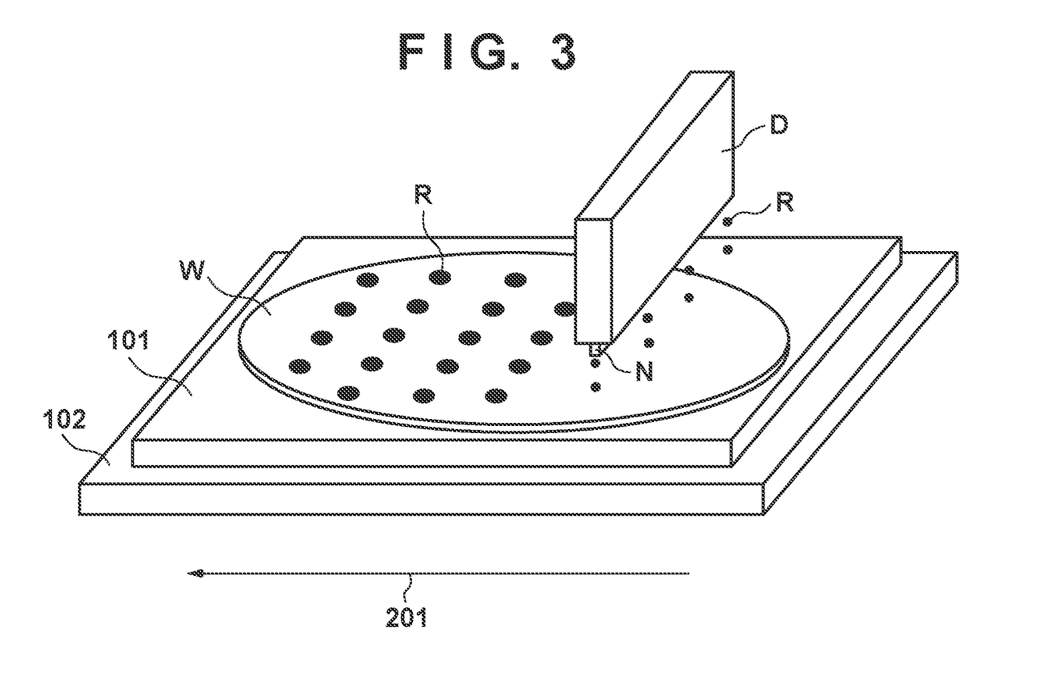
FIG. 3 is a view for explaining the supplying of an imprint material onto a substrate.

FIG. 2 is a view showing an example of a drop recipe RP which is managed by the console unit CONS. A drop recipe RP is also referred to as an application pattern. The drop recipe RP includes information related to the coordinates and the supplying amount to be used when the imprint material R is to be supplied on the substrate, that is, the information related to a supply position of each droplet of the imprint material R to be supplied to the substrate and an amount of each droplet of the imprint material R to be supplied to this supply position. The control unit CNT controls the substrate stage 102 and the supplying unit D so that the imprint material R will be supplied to each supply position on the substrate which is indicated by the drop recipe RP. More specifically, the control unit CNT causes, based on the drop recipe RP, a plurality of orifices N which are provided on the supplying unit D to discharge droplets of the imprint material R while moving the substrate stage 102 in the direction of an arrow 201 as shown in FIG. 3. As a result, an arrangement pattern of (the droplets) of the imprint material R that corresponds to the drop recipe RP is formed on the substrate. The control unit CNT can also control the moving unit MU so that the imprint material R will be supplied to each supply position on the substrate which is indicated by the drop recipe RP (to be described later). The moving unit MU moves the supplying unit D so as to change the relative positional relationship between the substrate W and the plurality of orifices N of the supplying unit D. The moving unit MU causes, for example, the supplying unit D to rotate about an axis (about the Z-axis) in a direction (the Z direction) in which the droplets of the imprint material R to be discharged from the plurality of orifices N of the supplying unit D are discharged.

By bringing (pressing) the mold into contact with the imprint material R supplied onto the substrate, the droplets of the imprint material R on the substrate are squashed and spread, and the imprint material R fills the pattern P of the mold M. For example, a concave portion which has an area larger than the area of the pattern P of the mold M is formed on the surface on the opposite side of the mold holding surface of the mold chuck 103. The concave portion forms a sealed space (a cavity portion) by being sealed by the mold M and a sealing glass (not shown). The cavity portion is connected to a pressure adjustment unit (not shown) which adjusts the pressure of the cavity portion. When the mold M and the imprint material R on the substrate are to be brought into contact with each other, it is possible to suppress air bubbles from being sandwiched between the substrate W and the mold M by increasing the pressure of the cavity portion to make the mold M to deform into a convex shape with respect to the substrate W. When the mold M and the imprint material R on the substrate have been brought into contact with each other, the pressure of the cavity portion is decreased back to its original value so that the mold M and the imprint material R will completely be in contact with each other.

The imprint apparatus IMP further includes alignment scopes 105 fixed to the mold stage 104. Each alignment scope 105 detects a corresponding alignment mark (substrate-side mark) 106 formed on (the shot region of) the substrate W and a corresponding alignment mark (mold-side mark) 107 formed on (the pattern P of) the mold M. To detect each of the substrate-side mark 106 and the mold-side mark 107, for example, an interference signal such as a moiré signal reflecting the relative position of the two marks can be used. The relative position of the two marks can be obtained by detecting an image of each of the substrate-side mark 106 and the mold-side mark 107.

The control unit CNT obtains the relative positional shift between the mold M and the substrate W from the detection results of the substrate-side marks 106 and the mold-side marks 107 obtained by the alignment scopes 105. The control unit CNT moves the substrate stage 102 and the mold stage 104 based on the relative positional shift between the mold M and the substrate W to correct the relative positional shift between the mold M and the substrate W. Note that the relative positional shift is not limited to a shift component and also includes a magnification component and a rotation component. In such a case, the shape of the pattern P of the mold M can be corrected in accordance with the shape of the shot region on the substrate.

The imprint apparatus IMP further includes a light source 108 which emits ultraviolet light, a detection light source 109 which emits detection light, a mirror 110, and an image capturing unit 111. The mirror 110 includes a dichroic mirror and has a property that allows the ultraviolet light from the light source 108 to be reflected and the detection light from the detection light source 109 to be transmitted. The imprint material R is cured by irradiating the imprint material R with the ultraviolet light from the light source 108 by causing the mirror 110 to reflect the ultraviolet light onto the imprint material R in a state in which the mold M and the imprint material R on the substrate have been brought into contact with each other. As a result, the pattern P of the mold M is transferred to the imprint material R on the substrate.

The detection light from the detection light source 109 is separated into light which is to be reflected by (the pattern P of) the mold M and light which is to be transmitted through the mold M and illuminate the shot region on the substrate. The light which is to illuminate the shot region is reflected on the surface of the substrate W, and the image capturing unit 111 detects this reflected light together with the light which is reflected by the mold M. An image corresponding to the detection light detected by the image capturing unit 111 can be displayed on the display unit 112 so that the user can observe the state (for example, the contact state of the mold M and the imprint material R on the substrate) of the imprint process.

Figure 4:
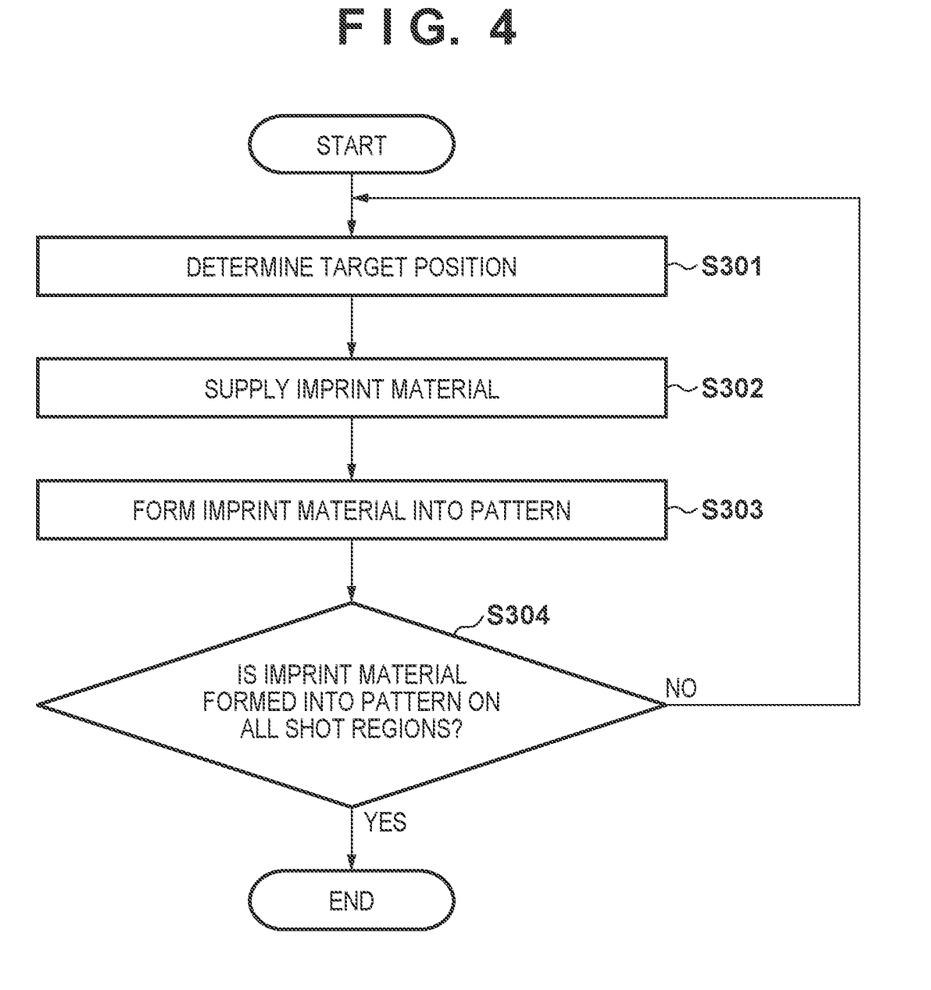
FIG. 4 is a flowchart for explaining an operation of the imprint apparatus shown in FIG. 1.

An operation, that is, an imprint process of the according to this embodiment will be described with reference to FIG. 4. As described above, the imprint apparatus IMP operates by causing the control unit CNT to integrally control the units of the imprint apparatus IMP. The memory of the control unit CNT stores, in advance, information related to the shot numbers, the positions on the substrate, and the like of a plurality of shot regions set on the substrate. Also, this embodiment will exemplify a case in which the imprint process is to be continuously performed on at least two shot regions of the plurality of shot regions set on the substrate. More specifically, the imprint material R is continuously supplied (at once) to at least two or more shot regions on the substrate, and a pattern made by the imprint material R will be continuously formed by bringing the mold M into contact with the imprint material R on the at least two or more shot regions. Hence, (the shot numbers of) all of the shot regions on the substrate are classified into (associated with) groups which are to continuously undergo the imprint process and stored in the memory of the control unit CNT. However, the operation of the imprint apparatus IMP is not limited to a case in which the imprint process is to be continuously performed on a plurality of shot regions (that is, a case in which so-called multiple dispensing is to be performed). For example, the imprint apparatus IMP may perform the imprint process (that is, may repeat the supplying of the imprint material R and the pattern formation) on each shot region. More specifically, the imprint material R can be supplied onto a single shot region on the substrate, and the mold M can be brought into contact with the imprint material R on the single shot region to form the imprint material R into a pattern.

The operation of the imprint apparatus IMP starts in a state in which the substrate W on which the imprint material R is to be formed into a pattern is held by the substrate stage 102 and the mold M is held by the mold chuck 103. In step S301, the control unit CNT determines (adjusts), for n (n is an integer equal to or more than 2) shot regions which are to continuously undergo the imprint process, the positions (target positions) on the substrate to which the droplets of the imprint material R are to be supplied from (the plurality of orifices N) of the supplying unit D. In this manner, the control unit CNT functions as a processing unit which performs processing to determine the positions on the substrate to which the droplets of the imprint material R are to be supplied. As will be described later, when each target position is to be determined in this embodiment, spread information which indicates the relationship between the elapsed time since the supplying unit D has supplied the imprint material R onto the substrate and the spread (the amount of the spread) of the droplet of the imprint material R on the substrate corresponding to this elapsed time is used. In addition, a predicted time from when the imprint material R is supplied onto the substrate by the supplying unit D until the mold M is brought into contact with the imprint material R is also used when the target position is to be determined.

In step S302, the control unit CNT controls the supplying unit D and the substrate stage 102 to supply the imprint material R to each of the n shot regions which are to continuously undergo the imprint process. More specifically, the substrate stage 102 which holds the substrate W is moved so that each of the n shot regions, which are to continuously undergo the imprint process, will pass (move) below the supplying unit D. During this operation, droplets of the imprint material R are discharged from the plurality of orifices N of the supplying unit D so that the droplets of the imprint material R will be supplied onto the target positions determined on each of the n shot regions in S301. As a result, the droplets of the imprint material R are supplied to (arranged on) the target positions on the n shot regions on the substrate W.

In step S303, the control unit CNT controls the substrate stage 102, the mold stage 104, the light source 108, and the like to form the imprint material R into a pattern on each of the n shot regions which are to continuously undergo the imprint process. More specifically, the substrate stage 102 which holds the substrate W is moved so that the shot region onto which the imprint material R has been supplied on the substrate will be positioned below the mold M. Next, the mold stage 104 which holds the mold M is moved (lowered) in the Z-axis direction to bring the mold M into contact with the imprint material R supplied onto the shot region on the substrate, and the imprint material R is cured by irradiating the mold M with ultraviolet light from the light source 108 via the mold M in this state. Subsequently, the mold stage 104 which holds the mold M is moved (raised) in the Z-axis direction to separate the mold M from the cured imprint material R on the substrate so that the imprint material R will be formed into a pattern on the shot region. The imprint material R can be formed into a pattern on each of the n shot regions by performing such an operation on all of the shot regions onto which the imprint material R has been supplied.

In step S304, the control unit CNT determines whether the imprint material R has been formed into a pattern on all of the shot regions on the substrate. If the imprint material R has not been formed into a pattern on all of the shot regions on the substrate, the process shifts to step S301 to continue the operation. On the other hand, if the imprint material R has been formed into a pattern on all of the shot regions on the substrate, the operation ends.

Figure 5A:
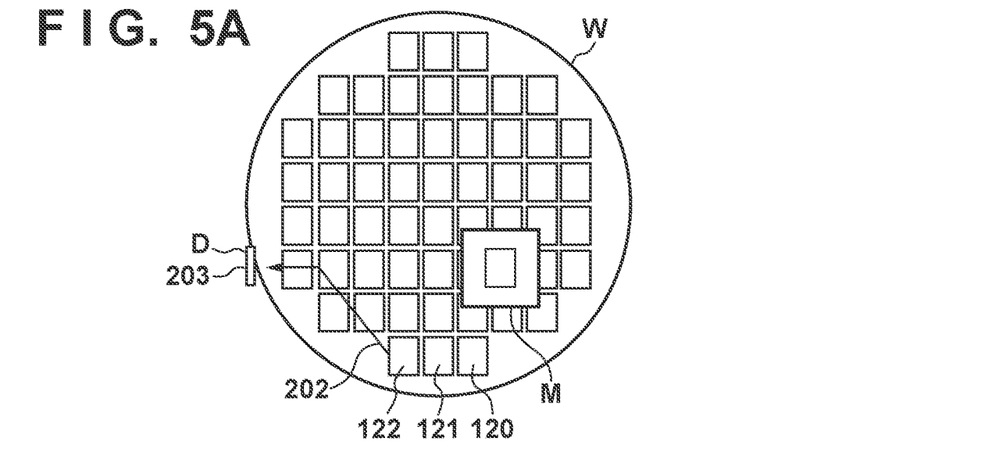
FIGS. 5A to 5C are views for explaining an operation performed from step S301 to step S303 shown in FIG. 4.
Figure 5B:
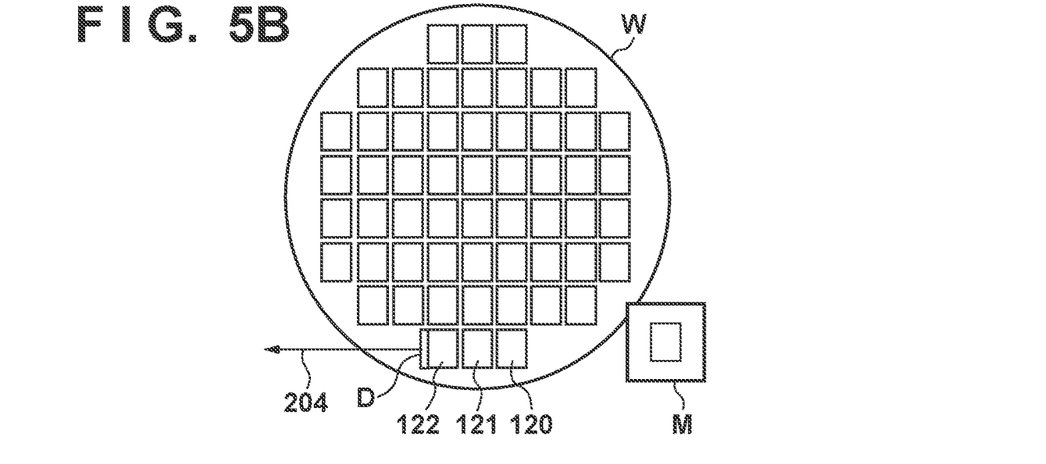
Figure 5C:
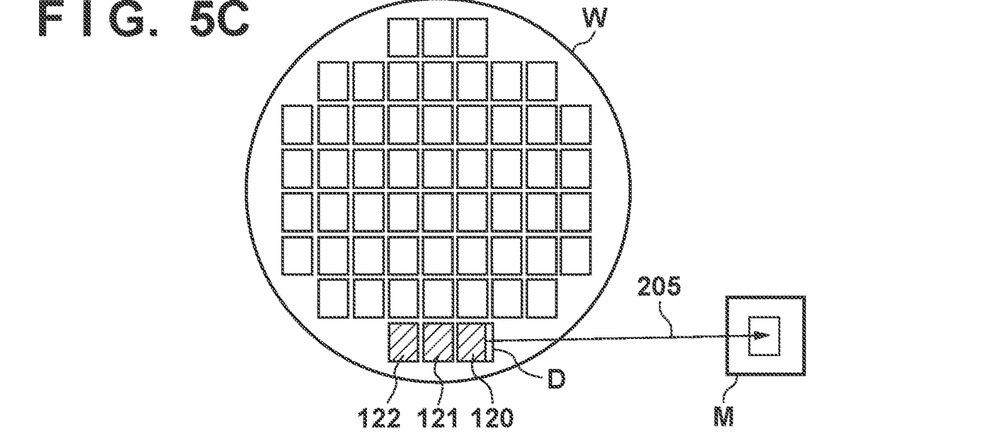
Figure 6A:
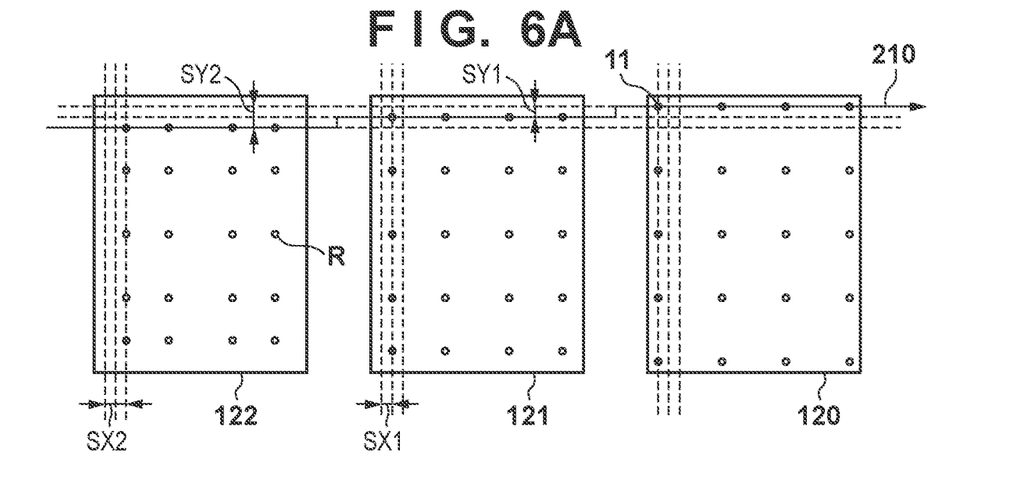
FIGS. 6A to 6C are views for explaining the operation performed from step S301 to step S303 shown in FIG. 4.
Figure 6B:
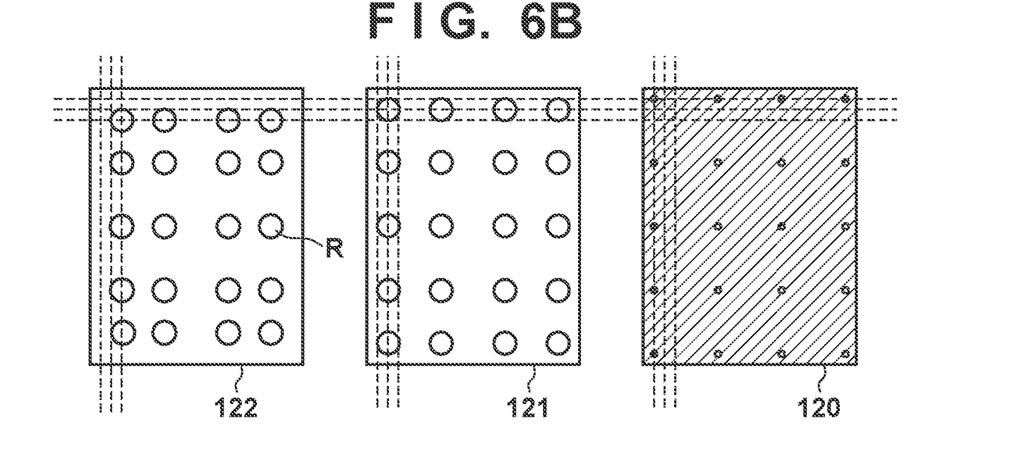

The operation performed from step S301 to step S303 shown in FIG. 4 will be described with reference to FIGS. 5A, 5B, and 5C and FIGS. 6A, 6B, and 6C. FIGS. 5A to 5C are views in which the substrate W is seen from the +Z direction. This embodiment will consider a case in which shot regions 120, 121, and 122 shown in FIGS. 5A to 5C are to continuously undergo the imprint process in this order. In this case, as shown in FIG. 6A, the control unit CNT will change (step S301) the target positions (supply positions) of the droplets of the imprint material R on the shot regions 121 and 122 with respect to the target positions of the droplets of the imprint material R on the shot region 120. More specifically, the target positions of the droplets of the imprint material R on the shot region 121 are shifted by an amount SX1 in the X direction and an amount SY1 in the Y direction with respect to the target positions of the droplets of the imprint material R on the shot region 120. The target positions of the droplets of the imprint material R on the shot region 121 are adjusted (determined) in this manner. In a similar manner, the target positions of the droplets of the imprint material R on the shot region 122 are shifted by an amount SX2 in the X direction and an amount SY2 in the Y direction with respect to the target positions of the droplets of the imprint material R on the shot region 120. The target positions of the droplets of the imprint material R on the shot region 122 are adjusted (determined) in this manner. In a case in which the imprint material R is to be continuously supplied to the shot regions 120, 121, and 122, the droplets of the imprint material R can be discharged from the plurality of orifices N of the supplying unit D while moving the substrate stage 102 in the direction of an arrow 210 as shown in FIG. 6A.

Note that in FIG. 6A, the target positions positioned at the periphery (the most outer side portion) of the target positions of the droplets of the imprint material R on the shot regions 121 and those of 122 have been changed toward the central direction of the substrate (so as to become closer to the target positions which are positioned closer to the inner side than these target positions). However, in each of the shot regions 121 and 122, the target positions which are positioned at positions other than the periphery or all of the target positions on the shot region may be changed, or each target amount may be shifted by using a different shift amount. In addition, the target positions of the droplets of the imprint material R may also be changed on the shot region 120.

As described above, when the target positions of the droplets of the imprint material R on the substrate have been determined for each of the shot regions 120, 121, and 122, the control unit CNT will move the substrate stage 102 holding the substrate W toward the supplying unit D. More specifically, as shown in FIG. 5A, the substrate stage 102 will be moved so that the shot region 122 will travel along a track 202 and reach a supplying start position 203 where the supplying unit D will start supplying the imprint material R.

When the shot region 122 has reached the supplying start position 203, the control unit CNT will move the substrate stage 102 so that the shot region 122 will travel along a track 204 as shown in FIG. 5B. At this time, the control unit CNT will supply the imprint material R to each of the shot regions 120, 121, and 122 in accordance with (the drop recipe indicating) the target positions of the droplets of the imprint material R on the shot regions 120, 121, and 122. As a result, the droplets of the imprint material R are supplied (arranged) onto the respective target positions on the shot regions 120, 121, and 122 (step S302).

When the operation to supply the imprint material R to the shot regions 120, 121, and 122 has been completed, the control unit CNT moves the substrate stage 102 so that the shot region 120 will travel along a track 205 and be positioned below the mold M as shown in FIG. 5C. Subsequently, as described above, the control unit CNT will control the substrate stage 102, the mold stage 104, the light source 108, and the like to form the imprint material R into a pattern on each of the shot regions 120, 121, and 122 (step S303).

Figure 6C:
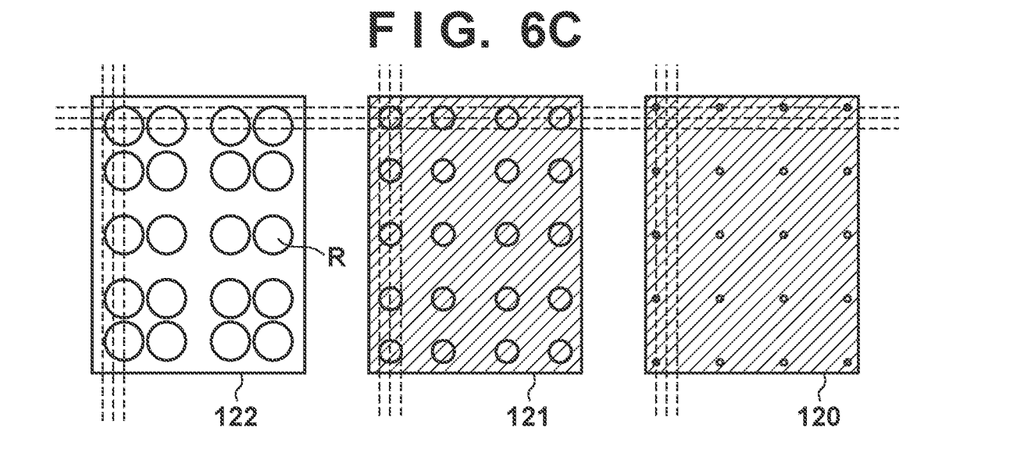

In this manner, by determining (adjusting), for each shot region on the substrate, the target positions on the substrate where the droplets of the imprint material R are to be supplied from the supplying unit D, the imprint material R can be suppressed from leaking outside (leakage) each shot region (the mold M) or the substrate W. For example, the droplets of the imprint material R supplied on the shot regions 121 and 122 may spread, as shown in FIGS. 6A and 6C, depending on the elapse of time from when the supplying unit D has supplied the imprint material R onto the substrate until the mold M is brought into contact with the imprint material R. Since (the droplets of) the imprint material R can be contained within each shot region in this embodiment even in such a case, leakage can be suppressed.

The determination of the target positions of the droplets of the imprint material R to be supplied from the supplying unit D to each of the shot regions on the substrate, that is, the calculation of the shift amount of the target positions for each shot region will be described with reference to FIGS. 7 and 8.

Figure 7:
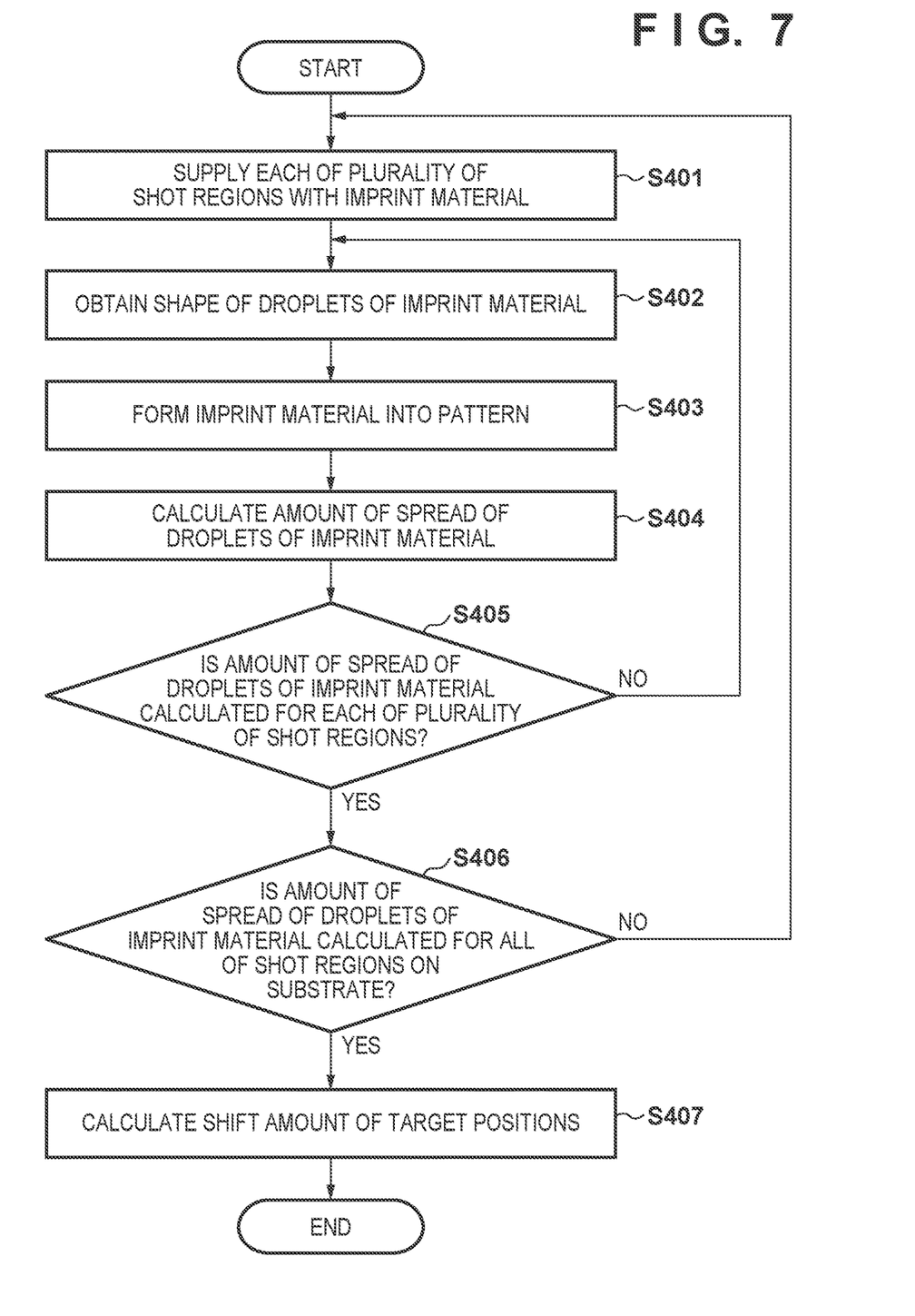
FIG. 7 is a flowchart for explaining the determination of target positions to which imprint material droplets are to be supplied from a supplying unit.

FIG. 7 is a flowchart of a case in which the shift amount of each shot region is determined by using information of the amount of the spread, that is, the above-described spread information, of the droplets of the imprint material R since the imprint material R has been supplied onto the substrate. In step S401, the imprint material R is supplied to each of the plurality of shot regions which are to continuously undergo the imprint process.

In step S402, the shape (the shape of the spread) of each droplet of the imprint material R immediately before the imprint material R and the mold M are brought into contact with each other (immediately before the start of pattern formation) is obtained for one shot region of the plurality of shot regions. When the shape of the spread of droplets of the imprint material R is to be obtained, it is preferable to use an image capturing system with a high magnification, and the alignment scopes 105 are used in this embodiment. However, another image capturing system may be used as long as the shape of the spread of the droplets of the imprint material R can be obtained, and for example, the image capturing unit 111 may also be used.

In step S403, the imprint material R is formed into a pattern on the one shot region of the plurality of shot regions on which the imprint material R has been supplied.

In step S404, the amount of the spread of the droplets of the imprint material R on the shot region on which the imprint material R has been formed into a pattern is calculated based on the shape of each droplet of the imprint material obtained in step S402. The amount of the spread of the droplets of the calculated in step S404 is information that indicates the relationship between the elapsed time since the imprint material R has been supplied and the spread of the droplets of the imprint material R on the substrate corresponding to this elapsed time. The amount of the spread of the droplets of the calculated in step S404 also includes information of the time (predicted time) from when the imprint material R has been supplied onto the substrate until the mold M is brought into contact with the imprint material R. In this embodiment, for example, the control unit CNT performs processing to calculate the amount of the spread of the imprint material R by setting a length in the vertical direction and a length in the horizontal direction as feature amounts. This processing includes, as an example, processing that compares the shape of each droplet of the imprint material R obtained in step S402 and the design value (theoretical value) of the shape of each droplet of the imprint material R on the substrate immediately after the imprint material R has been supplied from the supplying unit D.

In step S405, it is determined whether the amount of the spread of the droplets has been calculated for each of the plurality of shot regions on which the imprint material R has been supplied. If the amount of the spread of the droplets of the imprint material R has not been calculated for each of the plurality of shot regions on which the imprint material R has been supplied, the process shifts to step S402 to continue the calculation of the amount of the spread of the droplets of the imprint material R. On the other hand, if the amount of the spread of the droplets of the imprint material R has been calculated for each of the plurality of shot regions on which the imprint material R has been supplied, the process shifts to step S406.

In step S406, whether the amount of the spread of the droplets of the imprint material R has been calculated for all of the shot regions on the substrate is determined. If the amount of the spread of the droplets of the imprint material R has not been calculated for all of the shot regions on the substrate, the process shifts to step S401 to continue the calculation of the amount of the spread of the droplets of the imprint material R. On the other hand, if the amount of the spread of the droplets of the imprint material R has been calculated for all of the shot regions on the substrate, the process shifts to step S407.

In step S407, the shift amount of the target positions where the droplets of the imprint material R are to be supplied from the supplying unit D is calculated (determined), for each shot region, based on the amount of the spread of the droplets of the imprint material R calculated in step S404. The shift amount calculated in step S407 can be stored in the memory of the control unit CNT. For example, the amount of the spread of the droplets of the imprint material R in the horizontal direction of the shot region 121 and that of the shot region 122 can be stored as the shift amount SX1 and the shift amount SX2, respectively, and the amount of the spread of the droplets of the imprint material R in the vertical direction of the shot region 121 and that of the shot region 122 can be stored as the shift amount SY1 and the shift amount SY2, respectively, in the memory of the control unit CNT.

The calculation of the shift amount of the target positions of each shot region is completed in this manner. Note that although the amount of the spread of the droplets of the imprint material R is calculated for one shot region on which the imprint material R is to be formed into a pattern in FIG. 7, the spread of the droplets of the imprint material R may be calculated after the imprint material R has been formed into a pattern on all of the shot regions. In addition, when the spread of the droplets of the imprint material R is to be calculated, the pattern of the imprint material R may not be formed in step S403 because it is sufficient to obtain the shape of each droplet of the imprint material R at the time from when the imprint material R has been supplied until the mold M is to be brought into contact.

Figure 8:
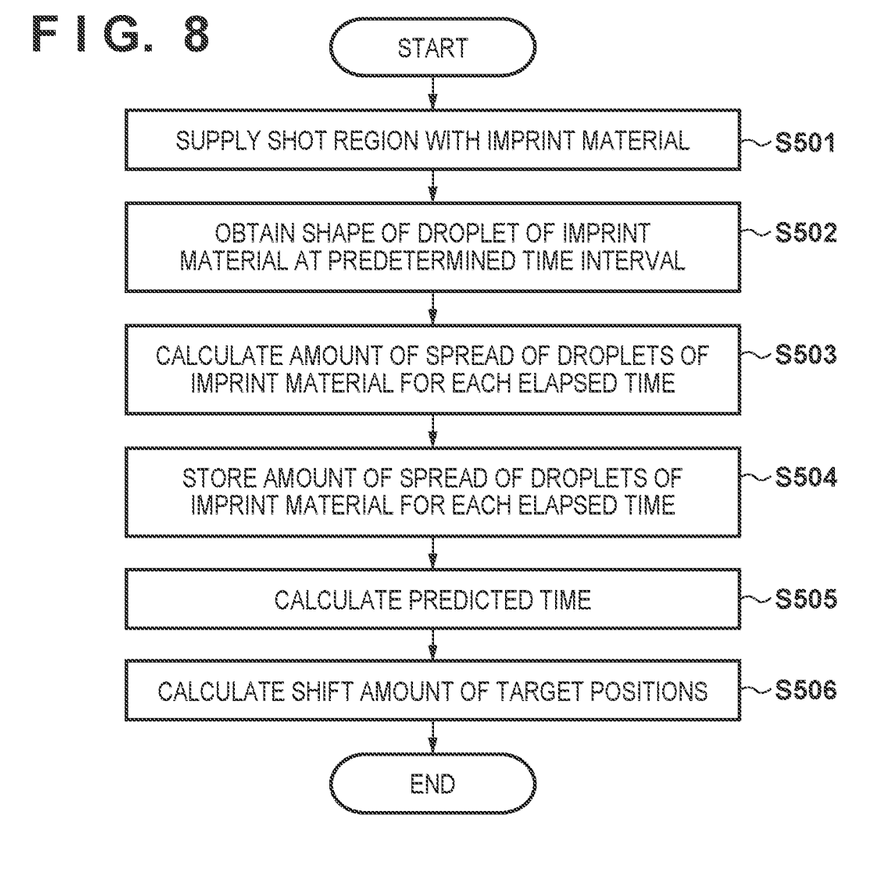
FIG. 8 is a flowchart for explaining the determination of the target positions to which the imprint material droplets are to be supplied from the supplying unit.

FIG. 8 is a flowchart of a case in which the shift amount of each shot region is determined by using the time (predicted time) from when the supplying unit D has supplied the imprint material R onto the substrate until the mold M is brought into contact with the imprint material R. In step S501, the imprint material R is supplied onto each shot region on the substrate.

In step S502, the shape (the shape of the spread) of the droplets of the imprint material R supplied onto the shot region on the substrate is obtained at predetermined time interval.

In step S503, the amount of the spread of the droplets of the imprint material R for each elapsed time since the supplying unit D has supplied the imprint material R onto the substrate is calculated. The amount of the spread of the droplets of the imprint material R which is calculated in step S503 is the information indicating the relationship between the elapsed time since the imprint material R has been supplied and the spread of the droplets of the imprint material R on the substrate corresponding to this elapsed time. In this embodiment, the length in the vertical direction and the length in the horizontal direction can be set as feature amounts, and the control unit CNT can perform processing, based on these feature amounts, to calculate the amount of the spread of the imprint material R for each elapsed time since the supplying unit D has supplied the imprint material R onto the substrate.

In step S504, the amount of the spread of the droplets of the imprint material R for each elapsed time calculated in step S503 is stored in, for example, the memory of the control unit CNT.

In step S505, the predicted time from when the supplying unit D has supplied the imprint material R onto the substrate until the mold M is brought into contact with the imprint material R is calculated for each of the plurality of shot regions on the substrate. More specifically, the control unit CNT calculates the predicted time for each shot region based on the information related to the shot number and the position on the substrate of each of the plurality of shot regions on the substrate, the movement time of the substrate stage 102, the pattern formation time, and the like stored in advance in the memory of the control unit CNT. The predicted time for each shot region may also be calculated based on an imprint recipe which indicates the various kinds of conditions set for the imprint process.

In step S506, the shift amount of the target positions of the droplets of the imprint material R to be supplied from the supplying unit D is calculated (determined) for each shot region based on the amount of the spread of the droplets of the imprint material R for each elapsed time calculated in step S504 and the predicted time calculated in step S505. Each shift amount calculated in step S506 can be stored in the memory of the control unit CNT.

The calculation of the shift amount of the target positions for each shot region is completed in this manner. Note that although the predicted time is calculated for each shot region (step S505) in FIG. 8, the predicted time which is input via the input unit 113 may be obtained instead of calculating the predicted time.

Figure 9:
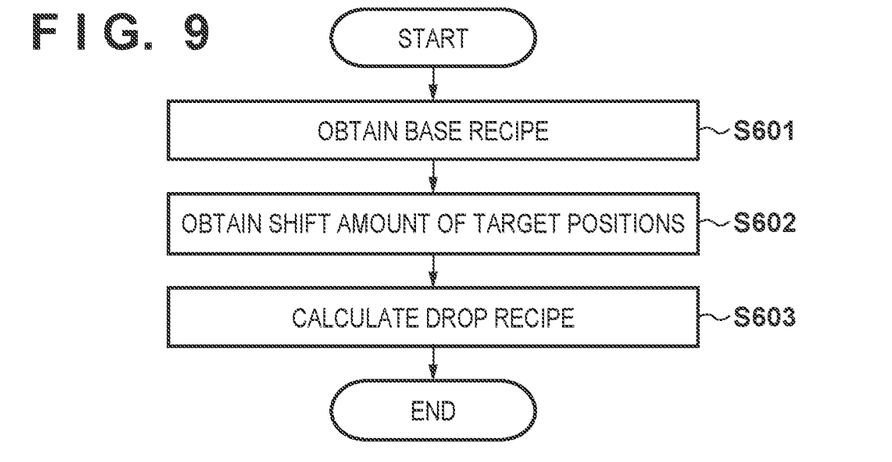
FIG. 9 is a flowchart for explaining processing to generate a drop recipe.

Next, processing to generate a drop recipe which is used for supplying the imprint material R onto the target positions on each shot region determined in the above-described manner will be described with reference to FIG. 9. In step S601, a drop recipe (base recipe) to be used as the base is obtained. In step S602, the shift amount of the target positions calculated in step S407 shown in FIG. 7 or in step S506 shown in FIG. 8 is obtained for each shot region. In step S603, the shift amount of the target positions obtained in step S602 is reflected onto the base recipe obtained in step S601 to calculate (generate) the final drop recipe RP (that is, to update the drop recipe RP) for each shot region.

Each drop recipe RP obtained in this manner is managed (stored) in a format that can be used by the imprint apparatus IMP. For example, each drop recipe RP is managed in a file format in the console unit CONS. Note that the processing to generate the above-described drop recipe may be performed by the control unit CNT or the console unit CONS. In addition, the supply amount of the imprint material R to be supplied to each target position may be changed by considering the vaporization of the imprint material R in accordance with the elapse of time since the supplying unit D has supplied the imprint material R onto the substrate.

Figure 10A:
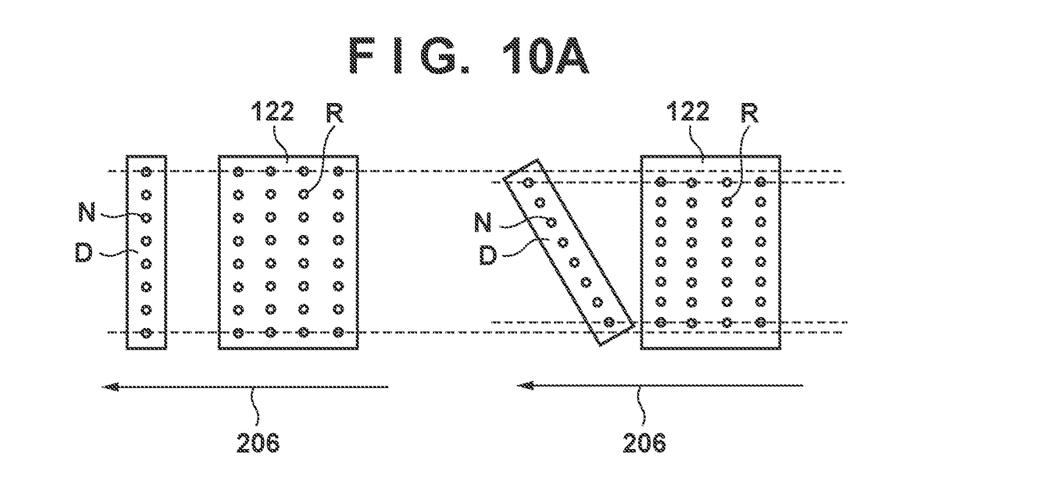
FIGS. 10A and 10B are views each showing a state in which the imprint material droplets are supplied onto the target positions on the substrate from a plurality of orifices of the supplying unit.
Figure 10B:
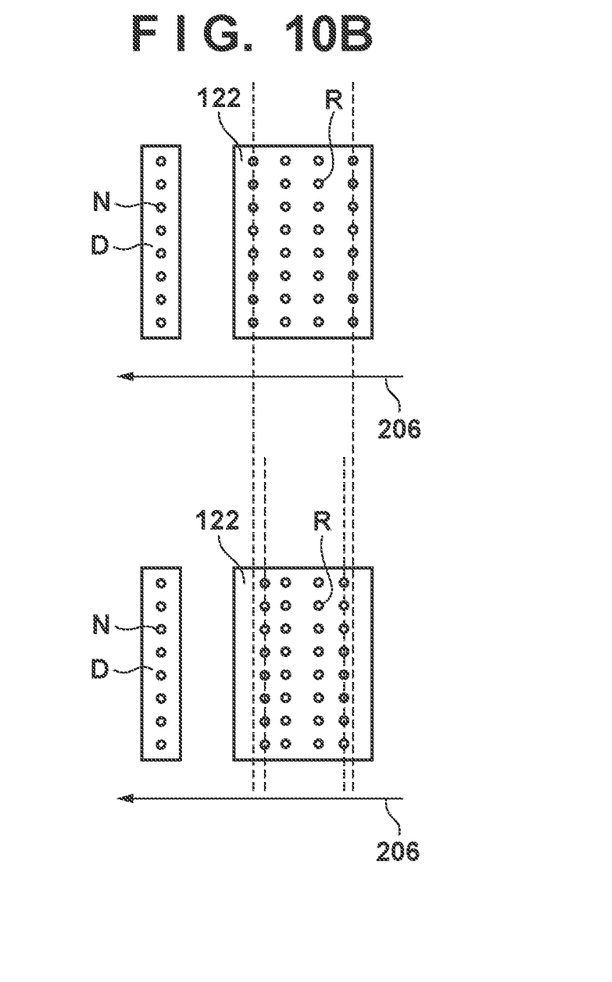

FIGS. 10A and 10B are views each showing a state in which the droplets of the imprint material R are supplied from the plurality of orifices N of the supplying unit D onto the target positions on the substrate. Instead of updating the drop recipe RP, the droplets of the imprint material R can be supplied to the target positions on the substrate by controlling the substrate stage 102 and the supplying unit D, as shown in FIGS. 10A and 10B, when the imprint material R is to be supplied. For example, as shown in FIG. 10A, the droplets of the imprint material R are discharged from the orifices N of the supplying unit D while the substrate stage 102 is moved in the direction of an arrow 206 in a state in which the supplying unit D has been rotated by the moving unit MU. As a result, the position (supply position) of each droplet of the imprint material R at the outermost position of the shot region 122 can be shifted in an inner direction. Also, when the substrate stage 102 is to be moved in the direction of the arrow 206, the discharge timing at which the imprint material R is discharged from each orifice N of the supplying unit D is delayed and the movement speed of the substrate stage 102 is increased. As a result, as shown in FIG. 10B, in the shot region 122, the position (supply position) of each droplet of the imprint material R in the X direction can be shifted in the inner direction. By combining these operations, the imprint material R can be supplied from the supplying unit D to the target positions on the substrate. In this manner, the supplying unit D is moved (rotated) and the movement (at least one of the track and the speed) of the substrate stage 102 when the substrate stage moved below the supplying unit D is controlled so that the droplets of the imprint material R will be supplied to the target positions on the substrate.

In this manner, in this embodiment, even in a case in which the droplets of the imprint material R have spread on the substrate in accordance with the elapsed time since the imprint material R has been supplied, the droplets of the imprint material R are supplied to positions on the substrate in correspondence with the spread. Hence, it is possible to suppress a so-called leakage in which the imprint material R leaks outside the shot region (the mold M) or the substrate W. and the pattern defects formed on the substrate can be reduced.

Note that although this embodiment described a case in which the imprint apparatus IMP (the control unit CNT) performs processing to determine the positions where the droplets of the imprint material R are to be supplied on the substrate, the processing may be performed by an (external) information processing apparatus outside the imprint apparatus. Therefore, such an information processing apparatus forms an aspect of the present invention. In addition, an imprint apparatus that includes an obtainment unit which obtains supply position information (a drop recipe or the like) indicating the positions where the droplets of the imprint material R are to be supplied on the substrate determined by such an information processing apparatus also forms an aspect of the present invention.

A cured product pattern formed using the imprint apparatus IMP is used permanently for at least some of various kinds of articles or temporarily when manufacturing various kinds of articles. The articles are an electrical circuit element, an optical element, a MEMS, a recording element, a sensor, a mold, and the like. Examples of the electrical circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The cured product pattern is directly used as the constituent member of at least some of the above-described articles or used temporarily as a resist mask. After etching or ion implantation is performed in the substrate processing step, the resist mask is removed.

Figure 11A:
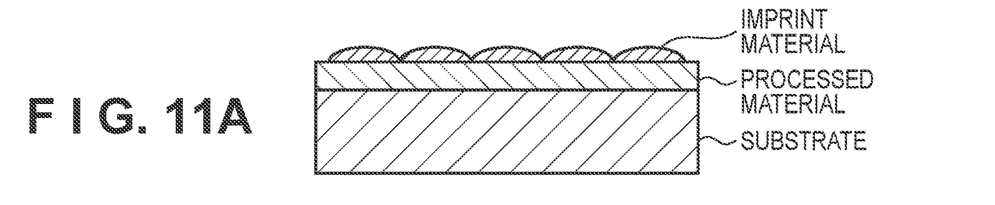
FIGS. 11A to 11F are views for explaining a method of manufacturing an article.

An article manufacturing method will be described in detail next. As shown in FIG. 11A, the substrate such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

Figure 11B:
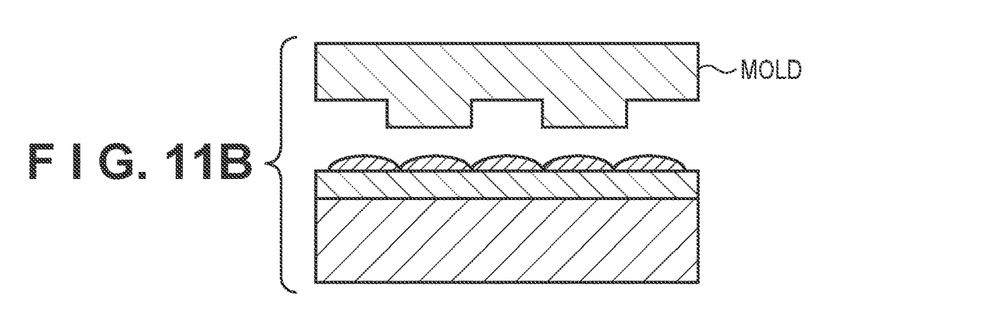
Figure 11C:
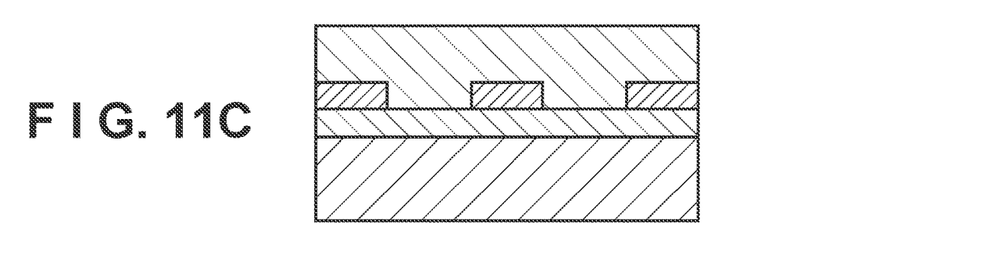

As shown in FIG. 11B, a side of the mold for imprint with an uneven pattern is directed to and made to face the imprint material on the substrate. As shown in FIG. 11C, the substrate to which the imprint material is applied is brought into contact with the mold, and a pressure is applied. A gap between the mold and the processed material is filled with the imprint material. When the imprint material is irradiated with light serving as curing energy through the mold in this state, the imprint material is cured.

Figure 11D:
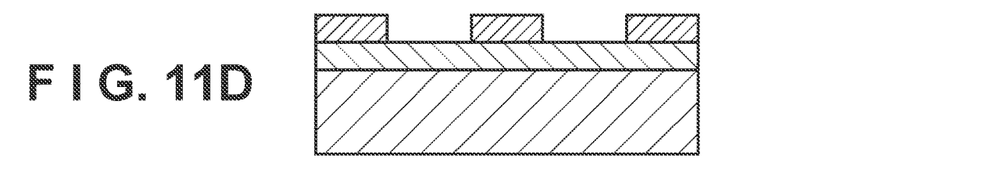

As shown in FIG. 11D, after the imprint material is cured, the mold is separated from the substrate, and a cured product pattern of the imprint material is formed on the substrate. In the cured product pattern, the concave portion of the mold corresponds to the convex portion of the cured product, and the convex portion of the mold corresponds to the concave portion of the cured product. That is, the uneven pattern of the mold has been transferred to the imprint material.

Figure 11E:
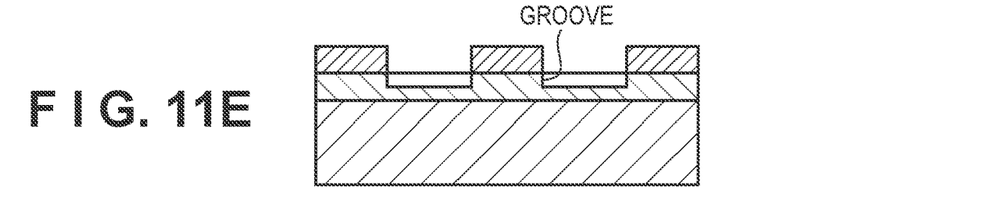
Figure 11F:
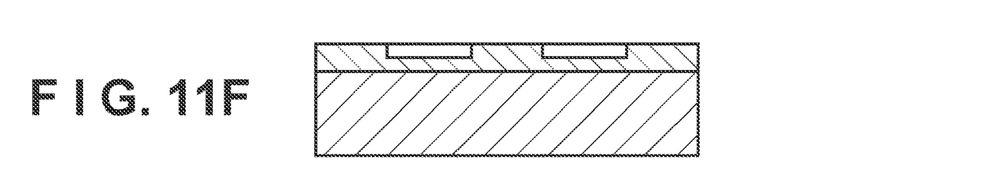

As shown in FIG. 11E, when etching is performed using the cured product pattern as an etching resistant mask, a portion of the surface of the processed material where the cured product does not exist or remains thin is removed to form a groove. As shown in FIG. 11F, when the cured product pattern is removed, an article with the grooves formed in the surface of the processed material can be obtained. The cured product pattern has been removed in this case. However, instead of processing or removing the cured product pattern, the cured product pattern may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2019-225760 filed on Dec. 13, 2019, which is hereby incorporated by reference herein in its entirety.

What is claimed is:

1. An imprint apparatus that forms an imprint material pattern on a substrate by using a mold, comprising:
   a dispenser including a plurality of orifices which discharge droplets of an imprint material, the dispenser being configured to supply the imprint material onto the substrate via the plurality of the orifices;
   a memory configured to store computer-executable instructions; and
   a processor configured to execute the computer-executable instructions stored in the memory to:
   obtain first positions where first droplets of imprint material are to be supplied onto a first region of the substrate by the dispenser;
   obtain an expected amount of spread of second droplets of imprint material to be supplied onto a second region of the substrate by the dispenser, the second region of the substrate being disposed outside the first region of the substrate,
   obtain a predicted time from when the dispenser supplies the second droplets of the imprint material onto the second region of the substrate until the mold is to be brought into contact with the second droplets of the imprint material on the second region of the substrate, and
   determine second positions where the second droplets of the imprint material are to be supplied onto the second region of the substrate based on (i) the first positions where the first droplets of the imprint material are to be supplied onto the first region of the substrate, (ii) the expected amount of spread of the second droplets of the imprint material to be supplied onto the second region of the substrate, and (iii) the predicted time from when the dispenser supplies the second droplets of the imprint material onto the second region of the substrate until the mold is to be brought into contact with the second droplets of the imprint material on the second region of the substrate.

2. The apparatus according to claim 1, wherein the processor executes the computer-executable instructions stored in the memory to determine the second positions where the second droplets of the imprint material are to be supplied onto the second region of the substrate so as not to cause the second droplets of the imprint material to leak outside at least one of the mold and the second region of the substrate when the mold is brought into contact with the second droplets of the imprint material on the second region of the substrate.

3. The apparatus according to claim 1, wherein the processor executes the computer-executable instructions stored in the memory to further:
   obtain the first positions where the first droplets of the imprint material are to be supplied from the dispenser onto the first region of the substrate from a drop recipe indicating the first positions,
   update the drop recipe so that the the updated drop recipe indicates the second positions where the second droplets of the imprint material are to be supplied onto the second region of the substrate.

4. The apparatus according to claim 3, wherein the processor executes the computer-executable instructions stored in the memory to update the drop recipe so that a supply position at an outermost first position indicated by the drop recipe will be changed.

5. The apparatus according to claim 4, wherein the processor executes the computer-executable instructions stored in the memory to update the drop recipe so that the supply position at the outermost fir position indicated by the drop recipe will become closer to a supply position which is positioned closer to an inner side than the supply position at the outermost first position.

6. The apparatus according to claim 1,
   wherein the processor executes the computer-executable instructions stored in the memory to further cause the dispenser to be moved so as to change a relative positional relationship between the substrate and the plurality of orifices,
   wherein the dispenser is moved so that the second droplets of the imprint material discharged from the plurality of orifices will be supplied onto the second positions in the second region of the substrate.

7. The apparatus according to claim 6, wherein the dispenser is rotatable about an axis parallel to a discharge direction of the droplets of the imprint material to be discharged from the plurality of orifices.

8. The apparatus according to claim 1, further comprising:
   a stage configured to hold and move the substrate,
   wherein the stage moves below the dispenser so that the second droplets of the imprint material discharged from the plurality of orifices will be supplied onto the second positions in the second region of the substrate.

9. The apparatus according to claim 8, wherein in the stage, at least one of a track of the stage when the stage is to move below the dispenser and a speed of the stage when the stage is to move below the dispenser is controlled so that the second droplets of the imprint material discharged from the plurality of orifices will be supplied onto the second positions in the second region of the substrate.

10. The apparatus according to claim 1, wherein the substrate includes a plurality of shot regions, and
    the processor executes the computer-executable instructions stored in the memory to, for each shot region of the plurality of shot regions, determine positions where droplets of the imprint material are to be supplied in the each shot region of the plurality of shot regions based on (i) the first positions where the first droplets of the imprint material are to be supplied onto the first region of the substrate, (ii) respective expected amounts of spread of the droplets of the imprint material to be supplied in the each shot region of the plurality of shot regions, and (iii) respective predicted times from when the dispenser supplies the droplets of the imprint material in the each shot region of the plurality of shot regions until the mold is to be brought into contact with the droplets of the imprint material in the each shot region of the plurality of shot regions.

11. The apparatus according to claim 10, wherein the processor executes the computer-executable instructions stored in the memory to cause the dispenser to continuously supplies-supply the imprint material on not less than two shot regions of the plurality of shot regions, and to cause the imprint material pattern to be continuously formed by bringing the mold into contact with the imprint material on the not less than two shot regions.

12. An imprint method that forms an imprint material pattern on a substrate by using a mold, the method comprising:

with the apparatus of claim 1, determining positions where droplets of an imprint material are to be supplied on the substrate based on information, which indicates a relationship between an elapsed time since the imprint material has been supplied on the substrate and a spread of the droplets of the imprint material on the substrate corresponding to the elapsed time, and a predicted time since the imprint material has been supplied onto the substrate until the mold is brought into contact with the imprint material; and with the apparatus of claim 1, supplying the droplets of the imprint material onto the positions on the substrate determined in the determining.

13. An article manufacturing method comprising:

forming a pattern on a substrate using an imprint apparatus defined in claim 1;

processing the substrate on which the pattern is formed in the forming; and manufacturing an article from the processed substrate.

14. An information processing apparatus that generates a drop recipe which is used in an imprint apparatus configured to form an imprint material pattern on a substrate by using a mold and indicates supply positions where droplets of an imprint material are to be supplied onto the substrate from a dispenser including a plurality of orifices which discharge the droplets of the imprint material and being configured to supply the imprint material onto the substrate via the plurality of orifices, the information processing apparatus comprising:

a memory configured to store computer-executable instructions; and a processor configured to execute the computer-executable instructions stored in the memory to:

obtain first positions where first droplets of imprint material are to be supplied onto a first region of the substrate by the dispenser;

obtain an expected amount of spread of second droplets of imprint material to be supplied onto a second region of the substrate by the dispenser, the second region of the substrate being disposed outside the first region of the substrate, obtain a predicted time from when the dispenser supplies the second droplets of the imprint material onto the second region of the substrate until the mold is to be brought into contact with the second droplets of the imprint material on the second region of the substrate, and determine the second positions where the second droplets of the imprint material are to be supplied onto the second region of the substrate based on (i) the first positions where the first droplets of the imprint material are to be supplied onto the first region of the substrate, (ii) the expected amount of spread of the second droplets of the imprint material to be supplied onto the second region of the substrate, and (iii) the predicted time from when the dispenser supplies the second droplets of the imprint material onto the second region of the substrate until the mold is to be brought into contact with the second droplets of the imprint material on the second region of the substrate.

\* \* \* \* \*